United States Patent
Andrieu et al.

(10) Patent No.: US 9,520,330 B2
(45) Date of Patent: Dec. 13, 2016

(54) INTEGRATED CIRCUIT COMPRISING PMOS TRANSISTORS WITH DIFFERENT VOLTAGE THRESHOLDS

(71) Applicants: Commissariat a L'Energie Atomique et aux Energies Alternatives, Paris (FR); International Business Machines Corporation, Armonk, NY (US)

(72) Inventors: Francois Andrieu, Saint Ismier (FR); Nicolas Degors, Le Versoud (FR); Pierre Perreau, Grenoble (FR)

(73) Assignees: Commissariat a L'Energie Atomique et aux Energies Alternatives, Paris (FR); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/978,428

(22) Filed: Dec. 22, 2015

(65) Prior Publication Data

US 2016/0197018 A1    Jul. 7, 2016

(30) Foreign Application Priority Data

Dec. 22, 2014    (FR) ...................................... 14 63174

(51) Int. Cl.
*H01L 21/00*    (2006.01)
*H01L 21/84*    (2006.01)
(Continued)

(52) U.S. Cl.
CPC ........... *H01L 21/84* (2013.01); *H01L 27/1203* (2013.01); *H01L 21/823412* (2013.01); *H01L 21/823462* (2013.01)

(58) Field of Classification Search
CPC ..................................................... H01L 21/84
(Continued)

(56) References Cited

U.S. PATENT DOCUMENTS 6,424,016 B1 *    7/2002   Houston ........... H01L 27/10894
                                                   257/296
8,492,210 B2 *    7/2013   Liang .................. H01L 21/8213
                                                   257/250
(Continued)

FOREIGN PATENT DOCUMENTS

EP      1 868 232 A1    12/2007
FR      2 925 979 A1    12/2007
(Continued)

OTHER PUBLICATIONS

Combined Search Report and Written Opinion issued Oct. 12, 2015 in French Patent Application No. FR1463174 (with English Translation of Category of Cited Documents).
(Continued)

*Primary Examiner* — Caleb Henry
(74) *Attorney, Agent, or Firm* — Oblon, McClelland, Maier & Neustadt, L.L.P.

(57) ABSTRACT

There is provided a method for the manufacture of an integrated circuit, including a substrate and an insulating layer formed on the substrate; a first pMOS transistor formed on the insulating layer and including a channel formed in a first layer of a silicon—germanium alloy, having a first thickness and first average germanium density; a gate oxide layer having a first equivalent oxide thickness; a second pMOS transistor formed on the insulating layer and further including a channel formed in a second layer of a silicon—germanium alloy, having a second thickness which is greater than the first and a second average germanium density which is lower than the first; and a gate oxide layer having a second equivalent oxide thickness which is greater than the first.

11 Claims, 5 Drawing Sheets

(51) Int. Cl.
*H01L 27/12* (2006.01)
*H01L 21/8234* (2006.01)

(58) Field of Classification Search
USPC .......................................................... 438/165
See application file for complete search history.

(56) References Cited

U.S. PATENT DOCUMENTS

| | | | | |
|---|---|---|---|---|
| 8,637,357 B2* | 1/2014 | Li | .................... | H01L 21/823857 |
| | | | | 438/153 |
| 8,846,463 B1* | 9/2014 | Or-Bach | ........... | H01L 21/76232 |
| | | | | 438/155 |
| 8,865,539 B2* | 10/2014 | Chen | ................. | H01L 21/76267 |
| | | | | 438/218 |
| 8,907,442 B2* | 12/2014 | Or-Bach | ............... | G03F 9/7076 |
| | | | | 257/368 |
| 8,912,052 B2* | 12/2014 | Or-Bach | .............. | H03K 17/687 |
| | | | | 257/E21.606 |
| 8,987,079 B2* | 3/2015 | Or-Bach | ............. | H01L 21/6835 |
| | | | | 438/198 |
| 9,000,557 B2* | 4/2015 | Or-Bach | ............. | H01L 21/8221 |
| | | | | 257/506 |
| 9,093,302 B2* | 7/2015 | Xie | ...................... | H01L 27/0886 |
| 9,136,153 B2* | 9/2015 | Or-Bach | ................. | G11C 8/16 |
| 9,275,911 B2* | 3/2016 | Cheng | .............. | H01L 21/845 |
| 9,318,388 B2* | 4/2016 | Xie | ................. | H01L 21/823437 |
| 9,373,702 B2* | 6/2016 | Li | ..................... | H01L 21/02532 |
| 2005/0127417 A1* | 6/2005 | Saenger | ............ | H01L 21/28194 |
| | | | | 257/295 |
| 2007/0108481 A1* | 5/2007 | Thean | ................. | H01L 27/1203 |
| | | | | 257/288 |
| 2007/0246702 A1* | 10/2007 | Andrieu | .................. | H01L 21/84 |
| | | | | 257/18 |
| 2007/0284624 A1 | 12/2007 | Iwai | | |
| 2008/0169508 A1* | 7/2008 | Chidambarrao | ........ | H01L 21/84 |
| | | | | 257/351 |
| 2008/0299711 A1* | 12/2008 | Anderson | ............... | H01L 21/84 |
| | | | | 438/154 |
| 2009/0072312 A1* | 3/2009 | Chang | ............. | H01L 21/823807 |
| | | | | 257/351 |
| 2010/0184260 A1 | 7/2010 | Luo et al. | | |
| 2013/0015526 A1* | 1/2013 | Liang | ................... | H01L 27/1203 |
| | | | | 257/351 |
| 2013/0049116 A1* | 2/2013 | Zhu | ..................... | H01L 27/1203 |
| | | | | 257/347 |
| 2013/0087855 A1* | 4/2013 | Makiyama | .............. | H01L 21/84 |
| | | | | 257/350 |
| 2014/0312423 A1 | 10/2014 | Cheng et al. | | |
| 2015/0179665 A1* | 6/2015 | Reboh | ............... | H01L 21/02532 |
| | | | | 257/351 |
| 2015/0206972 A1* | 7/2015 | Liu | ................. | H01L 21/823807 |
| | | | | 257/348 |
| 2015/0287614 A1* | 10/2015 | Cheng | ............. | H01L 21/823807 |
| | | | | 257/192 |

FOREIGN PATENT DOCUMENTS

FR 2 935 194 A1 8/2008
FR 2 936 095 A1 9/2008

OTHER PUBLICATIONS

Tsutomu Tezuka, et al., "Strained SOI/SGOI dual-channel CMOS technology based on the Ge condensation technique" Semiconductor Science and Technology, vol. 22, No. 1, XP020114875, 2007, pp. S93-S98.

A. Tanabe, et al., "p-n Junction Leakage Current in Strained-Si/SGOI Diodes" SiGe Technology and Device Meeting, 2006, 2 Pages.

V. V. Afanas'ev, et al., "Electronic properties of Ge dangling bond centers at Si 1 x Ge x / SiO 2 interfaces" Applied Physics Letters, vol. 95, 2009, 3 Pages.

Dong Wang, et al., "Defect characterization and control for SiGe-on-insulator" Solid-State and Integrated Circuit Technology, 2010, 4 Pages.

* cited by examiner

INTEGRATED CIRCUIT COMPRISING PMOS TRANSISTORS WITH DIFFERENT VOLTAGE THRESHOLDS

TECHNICAL FIELD

The invention relates to an integrated circuit, specifically an integrated circuit combining SiGe-channel PMOS field effect transistors constructed on an insulating layer.

The reduction of the static consumption of logic gates whilst increasing their flip-flop speed has been the subject of extensive research. Certain integrated circuits currently in development simultaneously incorporate low-consumption logic gates and logic gates with a high flip-flop speed. In order to produce these two types of logic gates on the same integrated circuit, the threshold voltage of certain transistors is reduced in order to form logic gates with a high flip-flop speed, and the threshold voltage of other transistors is increased to form low-consumption logic gates. In "bulk" technology, modulation of the threshold voltage level of transistors of the same type is frequently achieved by the differentiation of the transistor channel doping level.

However, in fully-depleted semiconductor-on-insulator technology, more commonly known by the acronym FDSOI, channel doping is low, which prevents the differentiation of threshold voltages by this means. One solution proposed in certain studies for the production of transistors of the same type with different threshold voltages involves the use of an electrically-polarized ground plane arranged between a thin oxide insulating layer and the silicon substrate. By adjusting the doping of ground planes and their electrical polarization, it is possible to define different threshold voltage ranges for these transistors. Accordingly, it is possible to produce low threshold voltage transistors, or LVTs, high threshold voltage transistors, or HVTs, and intermediate threshold voltage transistors, known as SVTs or RVTs. Typically, the threshold voltage of LVT transistors is equal to or lower than 350 mV, that of HVT transistors is equal to or greater than 500 mV, and that of RVT transistors ranges from 350 mV to 500 mV.

Manufacturing processes have been proposed, wherein different transistors are formed with different gate oxide thicknesses in the gate stacks formed on the transistors channels. A manufacturing process of this type is specifically described in the document "A 65 nm-node CMOS Technology with Highly Reliable Triple Gate Oxide Suitable for power-considered System-on-a-chip" by Fukai et al., published in "2003 Symposium on VLSI Technology, Digest of Technical Papers". A single-thickness gate oxide, or GO1, is used, for example, to increase the capacity of the gate and improve transistor performance. A thicker gate oxide, designated as GO2, or sometimes a third type of gate oxide are used in integrated circuits, designated as DGO or TGO respectively, in order to restrict gate leakages and power dissipation, whilst also increasing the breakdown voltage of these transistors. By different stages of masking and etching, three different equivalent gate oxide thicknesses, or EOTs, are obtained.

As the adjustment of the threshold voltage by manufacturing processes of this type is not perfect, additional stages for the incorporation of dopants into the channel are executed, for example, in order to improve the control of the threshold voltage. However, such incorporation of dopants may be harmful to transistors of the FDSOI type: for example, by increasing the variability of the threshold voltage of transistors, by the impairment of electrostatic characteristics. The achievement of balanced threshold voltages for nMOS and pMOS transistors in the same cell is also a delicate issue.

In pMOS transistors, in order to reduce the threshold voltage and increase the current density in the on state, it is possible to form a channel of a silicon—germanium alloy, customarily designated by the term SiGe. The higher the germanium concentration, the lower the absolute value of the threshold voltage.

A customary process for the formation of a SiGe channel with a high concentration of germanium is the process described as a condensation process. This process involves the epitaxial growth of a SiGe layer on a silicon layer, followed by the thermal oxidation of this SiGe layer. During oxidation, the silicon atoms participate in oxidation to form a surface layer of silicon oxide, whereas germanium diffuses into the core of the epitaxial layer. The germanium is immobilized between the oxide in the course of formation at the top, and the buried insulator of the substrate at the bottom. The condensation process thereby permits the achievement of a fine channel with a high density of germanium.

The majority of integrated circuits incorporate transistors with different supply voltages. In practice, transistors in logic circuits generally employ lower gate voltages than GO2 transistors. In consequence, GO2 transistors simultaneously require gate oxides with high breakdown voltages and low leakage currents in the off state. The off-state leakage current is a predominant parameter for GO2 transistors. However, a number of factors contribute to an increase in this leakage current for a GO2 pMOS transistor: a higher gate potential level, a fine channel, the thickness of which is the same as that employed in logic circuit transistors, in order to facilitate the manufacturing process, and leaks which are proportional to the germanium concentration in the channel.

No currently available process permits the straightforward co-integration of FDSOI pMOS transistors for logic circuits and for GO2 transistor circuits without severely impairing the desired performance, either of the logic circuits or of the circuits incorporating GO2 transistors.

Document US2010/184260 describes a process for the co-integration of different types of pMOS transistors with different equivalent gate oxide thicknesses. This document proposes the modulation of the threshold voltages of the different transistors by the adjustment of the various channel materials employed.

Document EP1868232 describes a method for the production of zones having a different germanium content on the same substrate, by using a process for the condensation of germanium. The aim of this process is to delay oxidation in certain zones, thereby producing zones with different properties of mobility and hole conduction. This document does not describe any practical application for different types of transistors.

The document "Strained SOI/SGOI dual-channel CMOS technology based on the Ge condensation technique" describes a method for the achievement of separate condensations for SiGe which is to be used in the formation of nMOS transistors and for SiGe which is to be used in the formation of pMOS transistors. The condensed SiGe is relaxed, as it forms the basis for the growth of silicon under tensile stress to form nMOS transistors. In pMOS transistors, SiGe under compression stress remains in contact with a buried insulating layer.

There is consequently a need for an integrated circuit, and for a method for the production of such an integrated circuit, which overcomes one or more of these disadvantages. The invention therefore relates to a method for the manufacture of an integrated circuit, as defined in the attached claims.

Further characteristics and advantages of the invention will be clarified by the description set out hereinafter, which is provided by way of indication and not by way of limitation, with reference to the attached drawings, in which.

The object of the invention is the co-integration of FDSOI pMOS transistors having different channel structures and gate oxide structures. In particular, the object of the invention is the formation of transistors with a higher gate thickness and a channel with a lower concentration of germanium, and transistors with a lower gate thickness and a channel with a higher concentration of germanium, using the same SiGe deposit.

pMOS transistors with a higher gate oxide thickness are frequently described in the literature by the term GO2, whereas pMOS transistors with a lower gate oxide thickness are frequently described in the literature by the term GO1. The invention is in particular intended to control the GIDL (Gate-Induced Drain Lowering) of pMOS transistors, specifically in a transistor of the GO2 type.

Figure 1:
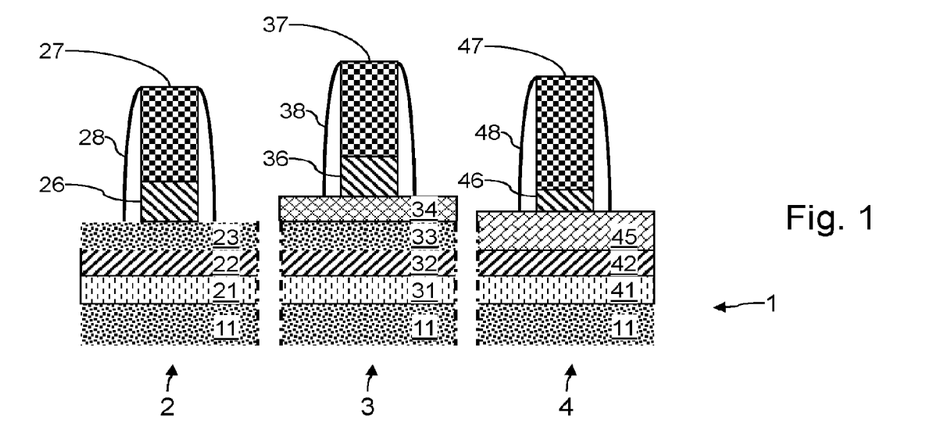
FIG. 1 shows a schematic cross-sectional view of different transistors in an example of integrated circuit according to the invention.

FIG. 1 shows a cross-sectional view of an example of integrated circuit 1 obtained by a method according to the invention. The dimensions illustrated are only intended to facilitate understanding, and are not to scale.

In this example, the integrated circuit 1 comprises FDSOI transistors, including a nMOS transistor 2, a pMOS transistor 3 (typically designed for use in a power circuit, an input/output circuit or an analog circuit) and a pMOS transistor 4, typically designed for use in a logic circuit.

The integrated circuit 1 comprises a semiconductor substrate 11. The substrate 11, for example, is a silicon-based substrate, typically a doped silicon substrate of the p type, with a concentration of dopants equal to or lower than $10^{16}$ cm$^{-3}$ or $3*10^{15}$ cm$^{-3}$.

The example illustrated here relates to transistors of the FDSOI type, controlled by a polarized and doped ground plane (also described in the literature as the back gate). A polarization circuit, not illustrated here, is provided for the polarization of the various ground planes, with dedicated or identical voltage levels. The transistors 2, 3 and 4 respectively are formed here plumb with the ground planes 21, 31 and 41. In the interests of simplification, the ground planes 21, 31 and 41 are illustrated here with the same doping. Wells may be interposed between the ground planes 21, 31, 41 and the substrate 11, for example for the isolation of the ground planes from the substrate or for the polarization of said ground planes. The structure of ground planes and any wells is known per se, and will not be described in greater detail.

A buried insulating layer is arranged between the ground planes 21, 31, 41 and the transistors 2, 3 and 4 respectively.

A buried insulator 22 is thereby interposed between the ground plane 21 and a semiconductor layer 23 in transistor 2, a buried insulator 32 is interposed between the ground plane 31 and a semiconductor layer 33, 34, and a buried insulator 42 is interposed between the ground plane 41 and a semiconductor layer 45. The buried insulating layer incorporating the buried insulators 22, 32 and 42 is of the UTBOX type (Ultra-Thin Buried Oxide), and is therefore of a thickness typically less than 50 nm, for example between 5 and 30 nm. The buried insulating layer may be formed of silicon oxide, in a manner which is known per se.

In the case of a buried insulating layer of the UTBOX type, the threshold voltage of transistors formed on this layer, in a manner which is known per se, is influenced by the type of doping and the polarization of ground planes arranged under said buried insulating layer. In practice, these parameters for ground planes can be used to control the electrostatic properties of the transistor channel.

The nMOS 2 transistor channel is designed for formation in the semiconductor layer 23. This semiconductor layer 23 is designed to form the transistor channel 2. The layer 23 is typically a low-doped silicon layer (typically $10^{15}$ cm$^{-3}$). The layer 23 typically shows a thickness ranging from 3 to 15 nm, typically 5 nm. A gate stack (the structure of which is known per se) of the transistor 2 is formed on the layer 23. The gate stack specifically comprises a gate metal 27, and a gate oxide 26. The gate metal 27 is formed on the gate oxide 26. The gate oxide 26 is formed on the layer 23. In an arrangement which is known per se, this gate stack incorporates lateral spacers 28.

The pMOS 3 transistor channel is designed for formation in the combination of semiconductor layers 33 and 34. In order to facilitate the description of the combination of layers 33 and 34, these are illustrated as two independent semiconductor layers. However, these layers 33 and 34 may be configured in the form of a single layer of relatively homogeneous composition. A transistor gate stack 3 is formed on the layer 34. The gate stack specifically comprises a gate metal 37 and a gate oxide 36. The gate metal 37 is formed on the gate oxide 36. The gate oxide 36 is formed on the layer 34. In an arrangement which is known per se, this gate stack incorporates lateral spacers 38 which are formed, for example, of an oxide, nitride or oxynitride, or of a low-permittivity oxide, such as SiBCN or SiOCN.

The combination of layers 33 and 34 is characterized by a cumulative thickness, which is designated as Ct3. Ds3 represents the surface dosing of germanium in the combination of layers 33 and 34. Dm3 represents the average density of germanium in the combination of layers 33 and 34. The gate oxide 36 shows a thickness designed as Gt3. The transistor 3 has a gate oxide 36 which is typically required to accommodate gate supply voltages of the order of 0.6V to 1.8V (i.e. voltages which are equal to or greater than the voltages applied to the gate 47). The thickness Gt3 is dimensioned to accommodate the field applied for such gate voltages.

The pMOS 4 transistor channel is designed for formation in the semiconductor layer 45. The layer 45 typically shows a thickness ranging from 3 to 15 nm, typically 5 nm. A gate stack of the transistor 4 is formed on the layer 45. The gate stack specifically comprises a gate metal 47 and a gate oxide 46. The gate metal 47 is formed on the gate oxide 46. The gate oxide 46 is formed on the layer 45. In an arrangement which is known per se, this gate stack incorporates lateral spacers 48.

The layer 45 is characterized by a thickness designated as Ct4. Ds4 represents the surface dosing of germanium in the layer 45. Dm4 represents the average density of germanium in the layer 45. The gate oxide 46 shows a thickness designated as Gt2. The transistor 4 has a gate oxide 46 which is typically required to accommodate gate supply voltages of the order of 0.5 to 1.2V (i.e. voltages which are lower than the voltages applied to the gate 37). The thickness Gt4 is dimensioned to accommodate the field applied for such gate voltages.

According to the invention, the following rules are observed:

Ct4<Ct3
Gt4<Gt3
Dm4>Dm3

Where Dm4>Dm3, the potential difference between the valence band and the conduction band (also described as the gap) of the pMOS 3 channel is greater than that of the pMOS 4. Accordingly, the GIDL (Gate-Induced Drain Lowering) is lower in the pMOS 3 than in the pMOS 4, thereby resulting in a lower off-state leakage current. Likewise, the relationship Ct4<Ct3 induces a GIDL which is lower in the pMOS 3 than in the pMOS 4. Leakage currents of the order of 1 to 10 pA per micrometre of gate length may be envisaged for a pMOS 3 transistor.

Preferably, one or more of the following rules may be observed:

1.2*Ct4<Ct3
1.5*Gt4<Gt3
Dm4>1.2*Dm3

Preferably, Dm4 is at least equal to 20%. Preferably, Dm3 is no more than 20%.

The following ranges of values will preferably be applied:
Ct3 between 7 and 20 nm, preferably equal to 12 nm;
Ct4 between 3 and 8 nm, preferably equal to 7 nm;

An example of method, which facilitates the co-integration of transistors 3 and 4 in compliance with these rules, is described in detail hereinafter.

Advantageously, the following rule will be observed: Ds3=Ds4±10%, resulting from the use of a single SiGe deposit to form the channels of transistors 3 and 4 from a single thickness of silicon-on-insulator.

FIGS. 2 to 6 illustrate different steps in an example of method for the manufacture of an integrated circuit according to the invention. From left to right, these cross-sectional views respectively illustrate the manufacture of a nMOS transistor 2, a pMOS transistor 3 of the GO2 type, and a pMOS transistor 4 of the GO1 type.

Figure 2:
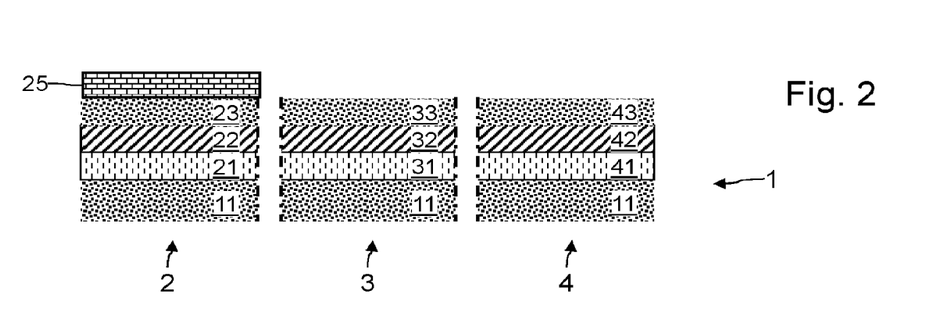
FIGS. 2 to 6 illustrate different steps in an example of method for the manufacture of an integrated circuit according to the invention.

In FIG. 2, the starting point is a substrate 11 as described above, to which the ground planes 21, 31 and 41, as described above, are applied. These ground planes 21, 31 and 41 are overlaid by the buried insulators 22, 32 and 42, as described above. The buried insulators 22, 32 and 42 are overlaid by a silicon layer comprising zones 23, 33 and 43 which are formed respectively on the buried insulators 22, 32 and 42. The silicon layer, for example, has an initial thickness of 7 nm. An insulator 25 is formed on zone 23. The insulator 25 is formed, for example, of silicon oxide and/or silicon nitride. The insulator 25 is configured such that it does not cover zones 33 and 43. In the interests of clarity, zones 33 and 43 are represented here as having the same thickness. As described hereinafter, zone 43, in practice, is of smaller thickness than zone 33, as a result of the execution of a localized partial etching step for example.

Figure 3:
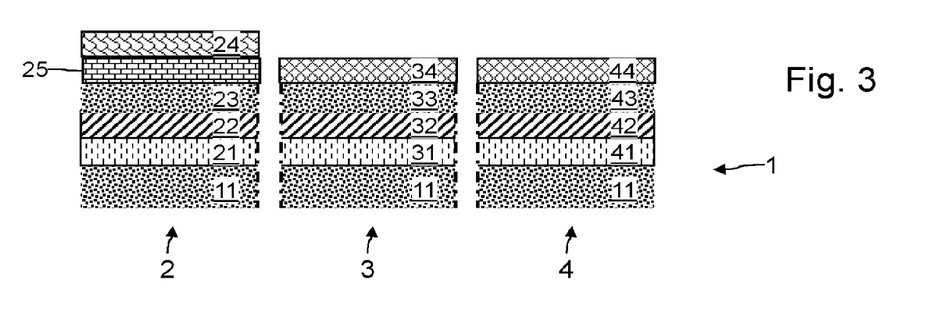

In FIG. 3, a mask 24 has been formed on the insulator 25, typically a hard mask. The mask 24 is configured such that it does not cover zones 33 and 43. The mask 24 is formed, for example, by resin photolithography, using a method which is known per se. The mask 24 may contain silicon oxide, silicon nitride, or a superposition of the two. The mask 24 is typically configured to define the locations of the nMOS transistors 2.

Afterwards to the constitution of the mask 24, SiGe deposits 34 and 44 are formed respectively on zones 33 and 43. SiGe deposits are typically formed by epitaxy. Zones 34 and 44 are formed in the same epitaxial growth step, and are consequently of the same thickness and contain the same concentration of SiGe. Examples of germanium concentration in deposits 34 and 44 are detailed hereinafter, but it may be envisaged to produce, for example, deposits 34 and 44 showing a germanium concentration of 27%. The epitaxial growth of SiGe is described as selective in relation to the insulator 25 (by an arrangement which is known per se), i.e. the SiGe deposits are essentially formed on zones 33 and 43. The germanium deposits 34 and 44 are formed, for example, to a thickness of 7 nm.

Figure 4:
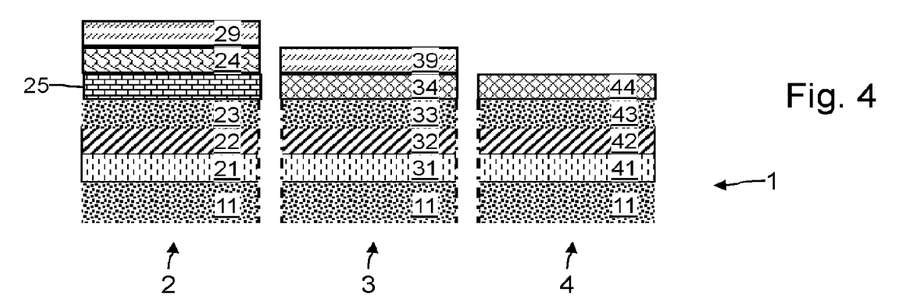

In FIG. 4, a mask 29 has been formed on the mask 24, and a mask 39 has been formed on the deposit 34. The masks 29 and 39 are typically hard masks. The masks 29 and 39 are configured such that they do not cover the deposit 44. The masks 29 and 39 may contain silicon oxide, silicon nitride or an overlayering of the two. The mask 39 is typically configured to define the locations of the pMOS transistors 3.

Steps of forming process, structuring or the creation of patterns (or patterning) by photolithography described in the present patent application may include the application of a photoresist, the exposure of the photoresist to a desired pattern and the development of the photoresist, followed by the transfer of the photoresist pattern to the lower layer(s) by means of one or more etching steps, for example dry etching or wet etching.

After the formation of the mask 39, the thickness of the deposit 44 may be optionally reduced, for example, by the maintenance of the deposit 44 in an atmosphere which is conducive to its depletion.

Figure 5:
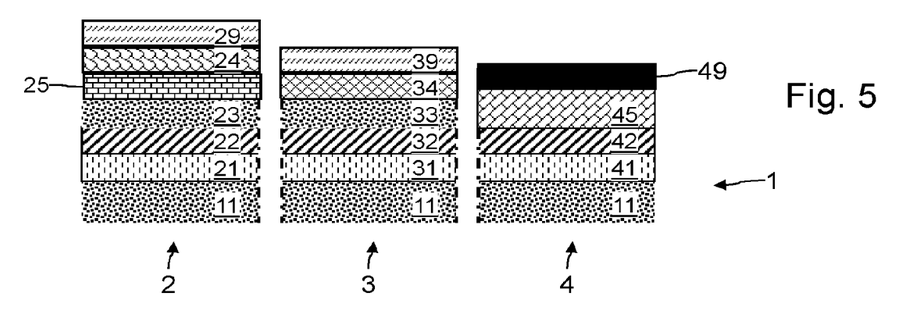

In FIG. 5, a method has been implemented for the condensation of the SiGe deposit 44. The condensation process results in the formation of a surface layer of thermal oxide 49. The formation of thermal oxide 49 results in an increase in volume in relation to the initial superimposition of the zone 43 and the deposit 44. The condensation process also results in an increase in the germanium concentration between the thermal oxide 49 and the buried insulator 42. Accordingly, germanium from the deposit 44 migrates to the silicon zone 43. This results in the formation of a SiGe layer 45 with a high concentration of SiGe. The thermal oxide 49 will then show a zero or negligible concentration of germanium, further to this migration.

The result is a layer 45, the thickness of which is smaller than the cumulative thickness of the layers 33 and 34. As a result of the conservation of the dosing of germanium, the average germanium concentration in layer 45 exceeds that in the combined layers 33 and 34.

The condensation process is inhibited in the SiGe deposit 34, as a result of the presence of the mask 39. The presence of nitride in the mask 39 permits the maximum limitation of any thermal oxidation of the deposit 34. A nitride mask 39 of minimum thickness 10 nm permits the complete blockage of the condensation process in the SiGe deposit 34.

The condensation process may be implemented in a manner which is known per se, using a method described as RTO (or Rapid Thermal Oxidation) at a temperature of 1,100° C., for a duration of approximately one minute.

The thickness of the layer 45 thus formed is advantageously smaller than the relaxation thickness of said layer 45, corresponding to its average germanium concentration.

Similarly, the thickness of layer 34 is advantageously smaller than its relaxation thickness, corresponding to its germanium concentration.

Figure 6:
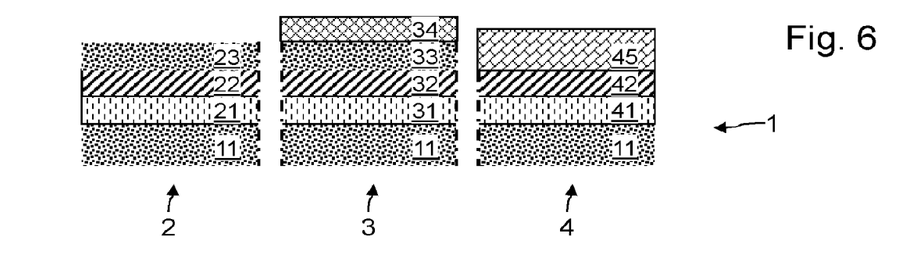

In FIG. 6, the masks 24, 29 and 39 have been removed. The insulator 25 has also been removed. The mask 24 and the masks 29 and 39 may be removed in the same step or in separate steps, according to their compositions. In the final stage of FIG. 6, the thermal oxide 49 has also been removed, such that the residual SiGe layer 45 shows a thickness which is smaller than the superposition of the zone 33 and the deposit 34. The layer 45, for example, may show a thickness of 8 nm, as against the starting layers 43 and 44, of respective thicknesses 6 nm and 7 nm. As the initial dosing of germanium in the deposit 44 is globally conserved in the residual SiGe layer, and is identical to the initial dosing of germanium in the deposit 34, the layer 45 shows a higher concentration of germanium than the superposition of layers 33 and 34.

Layers 33 and 34 are illustrated here as separate layers. In practice, as a result of the various steps of the manufacturing process executed at a temperature of more than 600° C., germanium in the deposit 34 migrates to the silicon in zone 33 to form a layer with a relatively uniform germanium concentration, in the majority of cases. The inhibition of condensation in layers 33 and 34 and the exploitation of the migration of germanium permit the formation of deposits 34 and 44 with high concentrations of germanium, with no risk of the formation of crystalline defects in the channel of transistor 3. Accordingly, it is possible to reduce off-state leakages from this transistor 3. In practice, studies have shown the difficulty of forming layers of SiGe with high concentrations of germanium by a condensation process.

In subsequent steps, which are not illustrated, gate stacks are formed by a method which is known per se, to obtain the structure illustrated with reference to FIG. 1.

The invention therefore permits the production of both pMOS 3 transistors and pMOS 4 transistors, which are optimized for their respective applications, using a relatively simple manufacturing process. The conservation of germanium in the channel of transistors 3 especially permits the reduction of the threshold voltage thereof to a satisfactory level, without the need, for example, for the particular polarization of the ground plane 31 or other parameters.

Figure 7:
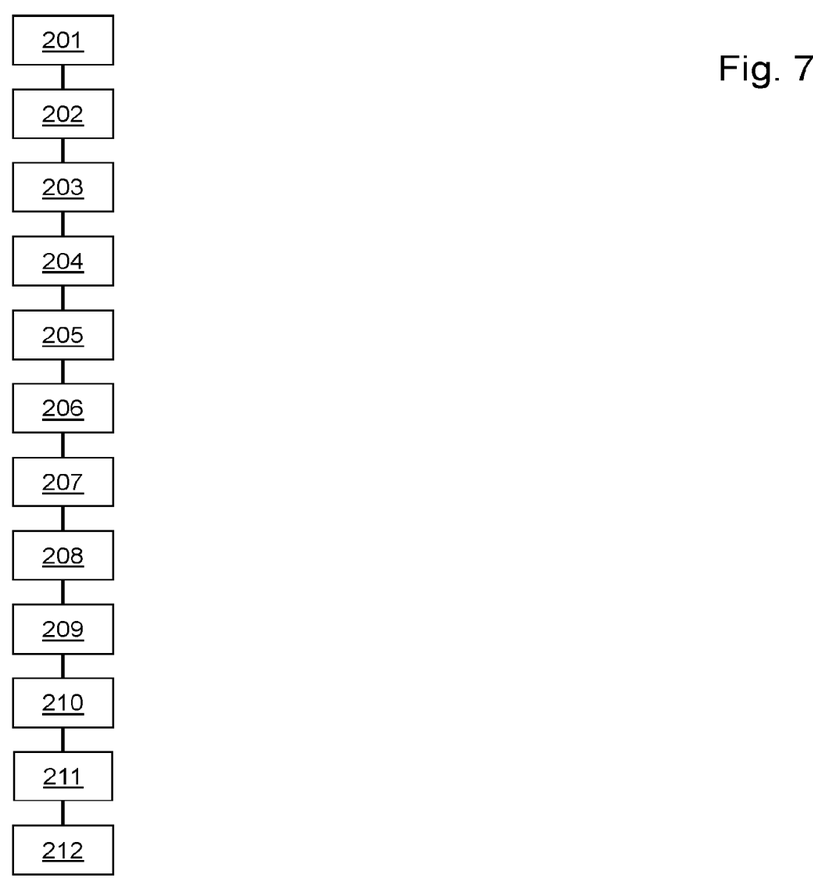
FIG. 7 shows a logic diagram for an example of method for the manufacture of integrated circuits according to the invention.

FIG. 7 summarizes the steps implemented in an example of method for the manufacture of an integrated circuit according to the invention.

Step 201 involves the provision of a substrate 11 comprising the ground planes 21, 31 and 41, overlaid respectively by the buried insulators 22, 32 and 42, and comprising zones 23, 33 and 43 of a silicon layer formed respectively on the buried insulators 22, 32 and 42. An insulator 25 is present on zone 23 of the silicon layer. Optionally, the ground planes 21, 31 and 41 may be formed during subsequent incorporation of dopants. A step for the reduction of the thickness of zone 43 in relation to the thickness of zone 33 is not illustrated here.

Step 202 involves the formation of a hard mask 24 on the insulator 25, and the configuration of the mask 24 to expose zones 33 and 43, for example by photolithography.

Step 203 involves the epitaxial formation of SiGe deposits 34 and 44 on zones 33 and 43. Step 203 may include the removal of any SiGe deposit from the insulator 25.

Step 204 involves the formation of a mask 29 on the mask 24, and the formation of a mask 39 on the SiGe deposit 34, together with the configuration of the masks 29 and 39 to expose the deposit 44, for example by photolithography.

The optional step 205 involves the thinning down of the deposit 44 by the maintenance of the integrated circuit in the course of formation, for example by means of an etching step or by maintenance in an appropriate atmosphere.

Step 206 involves the condensation of the deposit 44 by a RTO process, in order to form a surface layer of thermal oxide 49 and a layer of SiGe 45 below said thermal oxide 49.

Step 207 involves:
the removal of the thermal oxide 49 down to the SiGe layer 45, such that the thickness of the SiGe layer is smaller than the combined thickness of layers 33 and 34;
the removal of the masks 24, 29 and 39;
the removal of the insulator 25.

Step 208 involves the formation, by a method which is known per se, of isolation trenches (not illustrated) between the various transistors in the integrated circuit 1.

Step 209 involves the diffusion of germanium from the layer 34 to zone 33, further to at least one temperature-raising step. The diffusion of germanium is specifically initiated during the condensation of the deposit 44 or during the formation of isolation trenches (STI), but may proceed fractionally during one or several other operations involving an increase in temperature, for example above 600° C.

Step 210 may involve the incorporation of dopants into the substrate 11 in order to form ground planes 21, 31 and 41 below the buried insulators 22, 32 and 42 respectively.

Step 211 involves the formation and configuration of the gate stacks of transistors 2, 3 and 4 on the silicon zone 23, on the SiGe layer 34 and on the SiGe layer 45 respectively. The gate oxide 46 of the gate stack of transistor 4 shows a thickness which is smaller than that of the gate oxide 36 of the gate stack of transistor 3.

Step 212 involves the respective formation of sources and drains for the transistors 2, 3 and 4 in the integrated circuit 1, for example by incorporation, or by in-situ dosing and diffusion.

The following design rules may be applied for the dimensioning of transistors 3 and 4 in the integrated circuit 1. As the same SiGe deposit is used for the formation of the channels of transistors 3 and 4, it is assumed that the surface dosing of germanium is conserved and remains identical for the channels of transistors 3 and 4. Where Dsp is the surface dosing of germanium deposited, Dtd is the thickness of SiGe deposited and Dmd is the average germanium concentration in the SiGe deposited, the following relationship will then be observed:

$$Dsp = Dtd * Dmd = Ds3 = Dm3 * Ct3 = Ds4 = Dm4 * Ct4$$

$$Ct3 = Dtd + Dsi$$

Where Dsi is the thickness of silicon in zone 33 prior to the deposition of the SiGe layer.

The desired value of Ct4 is defined first. Ct4 may be defined, for example, by electrostatic criteria. By a general rule, a channel thickness for a pMOS transistor of the GO1 type is defined as approximately equal to one quarter of its gate length. Typically, for the 14 nm technology node, a gate length of 24 nm is applied. The desired value of Ct4 may therefore be defined as equal to 6 nm. The thickness Ct4 is governed, for example, by the temperature of the oxidation process or by the duration of said oxidation process.

The desired value of Dm4 is then defined, as a function of the desired threshold voltage and on-state current density for the transistor 4. The dosing of germanium Dsp to be deposited is deduced accordingly.

In general, the gate work output function and the germanium concentration in the channel are adjusted such that the threshold voltage of nMOS 2 and pMOS 4 transistors is balanced.

For example, the concentration Dm4 may be defined such that the following inequality is observed:

$$4.54-0.005*Dm4 \leq Phim \leq 4.59-0.005*Dm4$$

Where Phim is the work output function of the material of the gate metal 47 and of the gate metal 37.

The desired value of Dm3 is then defined, as a function of the desired threshold voltage for transistor 3 and in consideration, for example, of a 10 mV variation in the threshold voltage of the transistor 3 for each percent of germanium concentration Dm3. It may be considered that the threshold voltage of the transistor 3 is influenced by the average germanium concentration in layers 33 and 34, even if this germanium concentration is not entirely uniform over the thickness.

The thickness Ct3 may then be deduced from the previous relationship for the conservation of the dosing of germanium, and with the relationship Ct3=Dtd+Dsi.

Dsi and Dtd may be typically set, for example, at a value of 7 nm each. If Dsi=Dtd, where Dmd is the average concentration of the SiGe deposit, this gives an average concentration Dm4=Dmd/2.

The relationship for the conservation of the dosing of germanium may be adjusted to take account of any consumption of the layer 34 or of the layer 45, or to take account of the residual germanium in the layer 49 which is removed. It is observed that 2 nm of the deposits 34 and 44 may be consumed after their formation, and pending the formation of the gate stacks.

As an alternative for the definition of the desired value Dm3, a thickness Ct3 may be defined beforehand, and the corresponding value for Dm3 is then deduced therefrom.

Examples of parameters which might be envisaged are as follows:

Dm3=13%; Ct3=12.5 nm; Dm4=20%; Ct4=7 nm;
Dm3=20%; Ct3=12.5 nm; Dm4=50%; Ct4=5 nm;
Dm3=19%; Ct3=12.5 nm; Dm4=80%; Ct4=3 nm;
Advantageously, Dmd lies between 15 and 45%.
Advantageously, Dsi=Dtd.

Figure 13:
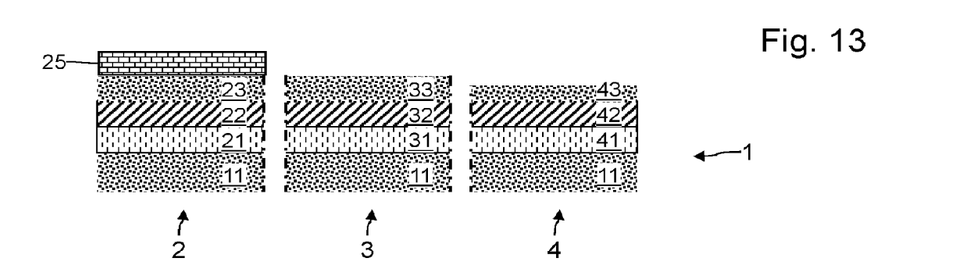
FIG. 13 illustrates an intermediate step in one variant of a method of manufacture according to the invention.

As illustrated in FIG. 13, as an intermediate step in the manufacturing process, the deposits 34 and 44 are formed on the silicon zones 33 and 43 of different thicknesses obtained, for example, by a photolithographic step and subject to localized removal, for example by wet etching or dry etching. Zone 43 is of smaller thickness than zone 33. Values for Ct4 and Dm4 may therefore be deduced straightforwardly, independently of values for Ct3 and Dm3.

As indicated previously, the relationship Gt4<Gt3 must be observed.

The thicknesses Gt3 and Gt4 considered are EOT thicknesses (or Equivalent Oxide Thicknesses). Indeed, the oxide layers 36 and 46 may each comprise a stack of layers, for example a stack of a silicon oxide layer with a dielectric layer Hk of high dielectric permittivity.

A dielectric permittivity greater than 6 is generally considered as characteristic of a dielectric layer Hk. In the present patent application, dielectric permittivity is defined as relative dielectric permittivity in relation to a vacuum. A layer Hk may, for example, be a layer of oxide, a metal silicate, or a material selected from the following materials (or a mixture of one or more of these materials): $HfO_2$, $ZrO_2$, $Al_2O_3$, $TiO_2$, $La_2O_3$, $STiO_3$, $Y_2O_3$, $Ga_2O_3$, GdGaO, hafnium silicate or silicon and hafnium oxynitride.

The calculation of the EOT thickness of a composite gate oxide layer, formed for example by the stacking of layers of different materials, will be known per se by a person skilled in the art.

For example, the value selected for Gt3 may range from 2 to 4 nm, and the value of Gt4 may range from 0.5 to 2 nm.

Figure 8:
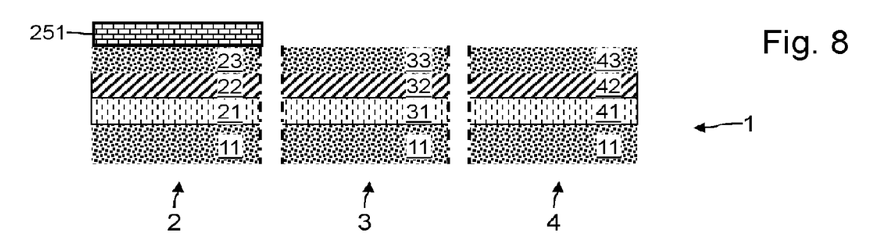
FIGS. 8 to 12 illustrate different steps in a further example of method for the manufacture of an integrated circuit according to the invention.

FIGS. 8 to 12 illustrate a variant of a manufacturing process for an integrated circuit 1 according to the invention. In FIG. 8, the starting point is a substrate 11 as described above, on which the ground planes 21, 31 and 41, as described above, are applied. These ground planes 21, 31 and 41 are overlaid by the buried insulators 22, 32 and 42, as described above. The buried insulators 22, 32 and 42 are overlaid by a silicon layer comprising zones 23, 33 and 43 which are formed respectively on the buried insulators 22, 32 and 42. The silicon layer, for example, has a thickness of 7 nm. A step for the thinning down of zone 43 in relation to zone 33 is not described in detail here. Accordingly, the difference in thickness between zones 33 and 43 is not illustrated in FIGS. 8 to 12. A hard mask 251 is formed on zone 23. The hard mask 251 is for example constituted as an insulator by the deposition of TEOS gas (tetraethyl orthosilicate), for example by a CVD (or Chemical Vapour Deposition) process. The hard mask 251 is configured such that it does not cover zones 33 and 43. The hard mask 251 may be deposited, for example, on a thickness ranging from 5 to 15 nm.

Figure 9:
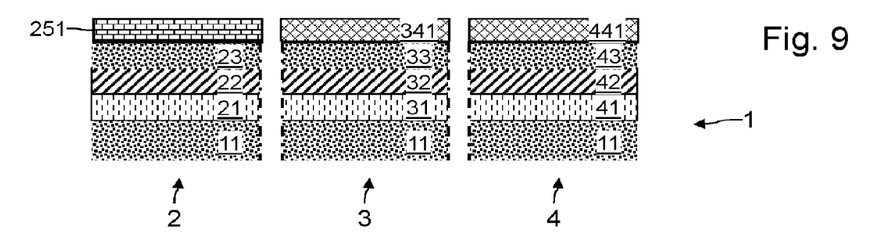

In FIG. 9, SiGe deposits 341 and 441 have been formed respectively on zones 33 and 43. SiGe deposits are typically formed by epitaxy. Zones 341 and 441 are formed in the same epitaxial growth step, and are consequently of the same thickness and contain the same concentration of SiGe. The deposits 341 and 441 may use the same parameters for germanium concentration and thickness as described previously. As the epitaxial growth of SiGe is selective in relation to the hard mask 251, SiGe deposits are essentially formed on zones 33 and 43.

Figure 10:
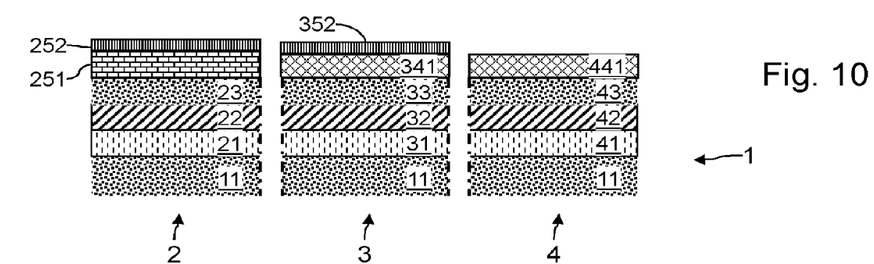
Figure 11:
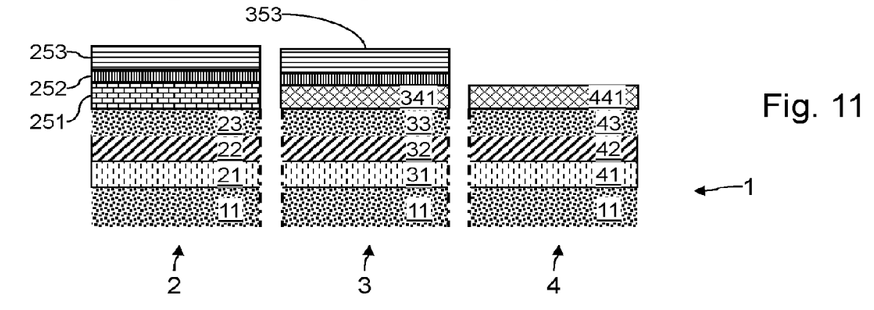

In FIG. 10, a further hard mask is formed. This further hard mask comprises a zone 252 formed on the hard mask 251 and a zone 352 formed on the deposit 341 (corresponding to 20 the transistor 3 in the course of formation). This further hard mask is, for example, made of insulator by the deposition of TEOS in the gaseous phase, or by epitaxy. This further hard mask is configured in zones 252 and 352 such that it does not cover the deposit 441. This further hard mask may show a thickness which is smaller than that of the hard mask 251, for example ranging from 3 to 8 nm.

In FIG. 10, a silicon nitride layer has been formed and configured. The silicon nitride layer comprises zones 253 and 353, covering zones 252 and 352 of the other hard mask respectively. The silicon nitride layer is configured such that it does not cover the deposit 441 corresponding to the location of the transistor 4 in the course of formation. The silicon nitride layer may show a thickness ranging from 5 to 15 nm.

Optionally, the thickness of the deposit 441 may be reduced, for example, by the maintenance of the deposit 441 in an atmosphere which is conducive to its thinning down or by the execution of a cleaning step.

Steps for configuration, structuring or the creation of patterns (or patterning) by photolithography described in the present patent application may include the application of a photoresist, the exposure of the photoresist to a desired pattern and the development of the photoresist, followed by the transfer of the pattern from the photoresist to the lower layer(s) by means of one or more etching steps, for example dry etching or wet etching.

Figure 12:
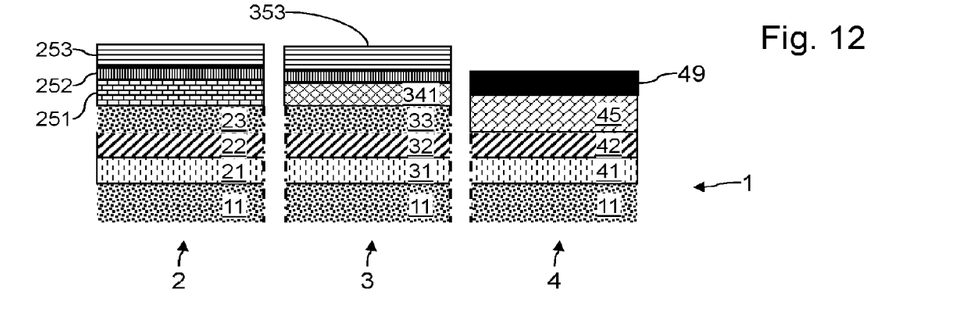

In FIG. 12, a method has been implemented for the condensation of the SiGe deposit 441. As detailed previously, the condensation process results in the formation of a surface layer of thermal oxide 49. The formation of thermal oxide 49 results in an increase in volume in relation to the initial superposition thickness of the zone 43 and the deposit 441. The condensation process also results in an increase in the germanium concentration in the semiconductor situated between the thermal oxide 49 and the buried insulator 42. Accordingly, germanium from the deposit 441 migrates to the silicon zone 43 to form a SiGe layer 45 with a high concentration of SiGe. The result is a layer 45, the thickness of which is smaller than the cumulative thickness of the layers 33 and 341. As a result of the conservation of the dosing of germanium, the average germanium concentration in layer 45 exceeds that in the combined layers 33 and 341.

The condensation process is inhibited in the SiGe deposit 341, as a result of the presence of zones 352 and 353, belonging respectively to the layer of the further hard mask and the layer of silicon nitride. The silicon nitride layer especially permits the maximum limitation of any thermal oxidation of the deposit 341.

The condensation process may be implemented in a manner which is known per se, using a RTO method at a temperature of 1,100° C., for a duration of approximately one minute.

The silicon nitride layer and the hard mask layers may then be removed.

The thermal oxide 49 is also removed, such that the residual SiGe layer 45 shows a thickness which is smaller than the superposition thickness of the zone 33 and the deposit 341. The layer 45, for example, may show a thickness of 8 nm, as against the starting layers 43 and 441, each of which has a thickness of 7 nm. As the initial dosing of germanium in the deposit 441 is globally conserved in the residual SiGe layer, and is identical to the initial dosing of germanium in the deposit 341, the layer 45 shows a higher concentration of germanium than the superposition of layers 33 and 341. Layers 33 and 341 are illustrated here as separate layers. As detailed previously, germanium in the deposit 341 migrates to the silicon in zone 33 during the various heating steps, to form a layer with a relatively uniform germanium concentration.

It is then possible to proceed with the formation and configuration of the gate stacks, to obtain the transistors 2, 3 and 4 as illustrated in FIG. 1.

The thickness of the layer 45 thus formed is advantageously smaller than the relaxation thickness of said layer 45, corresponding to its average germanium concentration. Similarly, the thickness of layer 341 is advantageously smaller than its relaxation thickness, corresponding to its germanium concentration.

In the examples illustrated above, the integrated circuit 1 systematically comprises a nMOS transistor, as a more effective illustration of a common requirement for co-integration. However, it is also possible to envisage an integrated circuit 1 according to the invention which is comprised of pMOS transistors only.

The invention claimed is:

1. A method for the manufacture of an integrated circuit incorporating first and second pMOS transistors, comprising:
   providing a substrate, an insulating layer formed on the substrate, and a silicon layer formed on at least first and second zones of the insulating layer;
   reducing a thickness of the silicon layer above the first zone of the insulating layer, such that the silicon layer in the first zone shows a smaller thickness than the silicon layer in the second zone;
   forming a first deposit of silicon—germanium on the silicon layer above the first zone of the insulating layer and a second deposit of silicon—germanium on the silicon layer above the second zone of the insulating layer;
   forming a mask covering the second deposit of silicon—germanium and exposing the first deposit of silicon—germanium;
   in the presence of said mask, condensing germanium in the first deposit to form silicon oxide on the surface of the first deposit, such that germanium is diffused into said silicon layer below the first deposit to form a layer of silicon—germanium between said silicon oxide and said first zone of the insulating layer;
   removing said formed silicon oxide, until a thickness of the formed layer of silicon—germanium is smaller than a cumulative thickness of the second deposit of silicon—germanium and the silicon layer above the second zone of the insulating layer, such that an average density of germanium in the thickness of the silicon—germanium layer formed from the second deposit is greater than an average density of germanium in the cumulative thickness of the second deposit of silicon—germanium and the silicon layer above the second zone;
   removing said formed mask; and
   forming, on said silicon—germanium layer, a first gate stack of the first pMOS transistor, said first gate stack incorporating a first gate oxide and forming, on said second deposit formed on the silicon layer, a second gate stack of the second pMOS transistor, said second stack incorporating a second gate oxide, wherein the second gate oxide has a second equivalent oxide thickness, which is greater than a first equivalent oxide thickness of the first gate oxide.

2. The method for the manufacture of an integrated circuit according to claim 1, wherein the formation of said first and second deposits of silicon—germanium includes the epitaxial growth of silicon—germanium.

3. The method for the manufacture of an integrated circuit according to claim 1, further comprising forming first and second ground planes respectively below the first and second zones of the insulating layer, wherein said forming includes the incorporation of dopants into the substrate.

4. The method for the manufacture of an integrated circuit according to claim 1, wherein the forming said mask comprises depositing a nitride to a minimum thickness of 10 nm.

5. The method for the manufacture of an integrated circuit according to claim 1, wherein the removal of silicon oxide is executed such that said formed silicon—germanium layer incorporates at least 90% of the germanium dosing from the first deposit of silicon-germanium.

6. The method for the manufacture of an integrated circuit according to claim 1, wherein said first and second deposits of silicon—germanium are formed simultaneously, and are of equal thickness, with an equal surface dosing of silicon—germanium.

7. The method for the manufacture of an integrated circuit according to claim 1, wherein said layer of silicon—germanium and said second deposit of silicon—germanium show respective thicknesses that are smaller than their respective relaxation thicknesses.

8. The method for the manufacture of an integrated circuit according to claim 1, wherein $1.2*Ct4<Ct3$, where $Ct4$ is a thickness of the layer of silicon-geranium formed between said silicon oxide and said first zone of the insulating layer, and Ct3 is said cumulative thickness.

9. The method for the manufacture of an integrated circuit according to claim 8, wherein Ct3 ranges from 7 nm to 20 nm and Ct4 ranges from 5 nm to 8 nm.

10. The method for the manufacture of an integrated circuit according to claim 1, wherein 1.5*Gt4<Gt3, where Gt4 is said first equivalent oxide thickness and Gt3 is said second equivalent oxide thickness.

11. The method for the manufacture of an integrated circuit according to claim 1, wherein said substrate provided is of the SOI type, and wherein the channels of the first and second pMOS transistors formed are of the fully-depleted type.

* * * * *